(12) United States Patent
Fornasiero et al.

(10) Patent No.: US 10,737,128 B2
(45) Date of Patent: Aug. 11, 2020

(54) ULTRA-BREATHABLE AND PROTECTIVE MEMBRANES WITH SUB-5 NM CARBON NANOTUBE PORES

(71) Applicant: Lawrence Livermore National Security, LLC, Livermore, CA (US)

(72) Inventors: Francesco Fornasiero, Oakland, CA (US); Kuang Jen J. Wu, Cupertino, CA (US); Sangil Kim, Chicago, IL (US)

(73) Assignee: Lawrence Livermore National Securing, LLC, Livermore, CA (US)

( * ) Notice: Subject to any disclaimer, the term of this patent is extended or adjusted under 35 U.S.C. 154(b) by 166 days.

(21) Appl. No.: 15/441,153

(22) Filed: Feb. 23, 2017

(65) Prior Publication Data

US 2018/0236287 A1    Aug. 23, 2018

(51) Int. Cl.
*A62D 5/00* (2006.01)
*B01D 69/14* (2006.01)
(Continued)

(52) U.S. Cl.
CPC .......... *A62D 5/00* (2013.01); *B01D 67/0079* (2013.01); *B01D 69/148* (2013.01);
(Continued)

(58) Field of Classification Search
CPC .... A62D 5/00; B01D 67/0079; B01D 69/148; B01D 71/021; B01D 71/28; B01D 2325/20; B01D 71/027; B01D 71/024; B01D 71/02; B01D 69/147; B01D 2319/04; B01D 53/227; B01D 53/34; B01D 53/74; B01D 2053/223; B01D 2053/224; B01D 63/00; B01D 63/005; B01D 63/06; B01D 69/00; B01D 69/04; B01D 69/043; B01D 69/046; B01D 52/228; B01D 61/027; C23D 16/26; C23D 16/45525; B82Y 30/00;
(Continued)

(56) References Cited

U.S. PATENT DOCUMENTS 9,475,263 B1 * 10/2016 Rangan ................ B32B 27/00
2011/0077347 A1 * 3/2011 Reinartz ................ C08L 39/06
524/508

(Continued)

OTHER PUBLICATIONS

Bui et al., Ultrabreathable and Protective Membranes with Sub-5 nm Carbon Nanotube Pores, Advanced Materials Apr. 23, 2016, vol. 28, pp. 5871-5877.*

(Continued)

*Primary Examiner* — Camie S Thompson
(74) *Attorney, Agent, or Firm* — Zilka-Kotab

(57) ABSTRACT

In one embodiment, a product includes a plurality of carbon nanotubes and a fill material in interstitial spaces between the carbon nanotubes for limiting or preventing fluidic transfer between opposite sides of the product except through interiors of the carbon nanotubes. Moreover, the longitudinal axes of the carbon nanotubes are substantially parallel, where an average inner diameter of the carbon nanotubes is about 20 nanometers or less. In addition, the ends of the carbon nanotubes are open and the fill material is impermeable or having an average porosity that is less than the average inner diameter of the carbon nanotubes.

24 Claims, 7 Drawing Sheets

(51) Int. Cl.
*B01D 67/00* (2006.01)
*C23C 16/26* (2006.01)
*C23C 16/04* (2006.01)
*C23C 16/56* (2006.01)
*C23C 16/44* (2006.01)
*B01D 71/02* (2006.01)
*B01D 71/28* (2006.01)
*B01D 69/02* (2006.01)

(52) U.S. Cl.
CPC ............ *C23C 16/045* (2013.01); *C23C 16/26* (2013.01); *C23C 16/4418* (2013.01); *C23C 16/56* (2013.01); *B01D 67/0034* (2013.01); *B01D 67/0037* (2013.01); *B01D 67/0041* (2013.01); *B01D 69/02* (2013.01); *B01D 71/021* (2013.01); *B01D 71/28* (2013.01); *B01D 2325/20* (2013.01)

(58) Field of Classification Search
CPC ...... B82Y 40/00; B01J 21/185; C02F 21/185; C02F 2305/08; C02F 1/442; Y10T 442/2516; Y10T 442/2525; Y10T 442/2221; Y10T 442/2139; Y10T 428/249953; A62B 17/006; B32B 2307/24; B32B 7/06; H01M 4/583; H01G 11/24; H01G 11/36; C01B 2202/02; C01B 2202/06; C01B 2202/36; C01B 32/158; C01B 32/159; Y02C 10/10; A61M 1/34; A61M 1/341
USPC ..... 428/293.7, 304.4; 210/651, 321.8, 502.1, 210/645, 650, 767; 96/4; 2/457; 442/121, 122, 76; 423/445 R; 95/273; 264/41; 977/742, 750, 752, 842, 962
See application file for complete search history.

(56) References Cited

U.S. PATENT DOCUMENTS

2011/0253630 A1  10/2011 Bakajin et al.
2015/0238906 A1* 8/2015 Krauss .................. B01D 63/06
                                                       428/220

OTHER PUBLICATIONS

Gugliuzza et al., "A review on membrane engineering for innovation in wearable fabrics and protective textiles," Journal of Membrane Science, vol. 446, Jul. 2013, pp. 350-375.
Hinds et al., "Aligned Multiwalled Carbon Nanotube Membranes," Science, vol. 303, No. 62, Jan. 2, 2004, pp. 62-65.
Kim et al., "Fabrication of flexible, aligned carbon nanotube/polymer composite membranes by in-situ polymerization," Journal of Membrane Science, vol. 460, Feb. 2014, pp. 91-98.
Holt et al., "Fast Mass Transport Through Sub-2-Nanometer Carbon Nanotubes," Science, vol. 312, May 19, 2006, pp. 1034-1037.
Fornasiero et al., "pH-Tunable Ion Selectivity in Carbon Nanotube Pores," Langmuir Article, vol. 26, Aug. 2010, pp. 14848-14853.
Fornasiero et al., "Ion exclusion by sub-2-nm carbon nanotube pores," PNAS, vol. 105, No. 45, Nov. 11, 2008, pp. 17250-17255.
Majumder et al., "Enhanced flow in carbon nanotubes," Nature, vol. 483, Nov. 3, 2005, pp. 44.
Subramaniam et al., "Non-spherical bubbles," Nature, vol. 438, Dec. 15, 2005, pp. 930.
Krishnakumar et al., "Mass transport through vertically aligned large diameter MWCNTs embedded in parylene," Nanotechnology, vol. 23, Oct. 12, 2012, pp. 1-9.
Zhang et al., "Gas transport in vertically-aligned carbon nanotube/parylene composite membranes," ScienceDirect, Carbon, vol. 66, Aug. 2013, pp. 1-17.
Majumder et al., "Mass Transport through Carbon Nanotube Membranes in Three Different Regimes: Ionic Diffusion and Gas and Liquid Flow," ACSNANO, vol. 5, No. 5, Apr. 18, 2011, pp. 3867-3877.
Brewer, S., "Recent Advances in Breathable Barrier Membranes for Individual Protective Equipment," Recent Patents on Materials Science, vol. 4, No. 1, 2011, pp. 1-14.
Bui et al., "Ultrabreathable and Protective Membranes with Sub-5 nm Carbon Nanotube Pores," Advanced Materials, vol. 28, 2016, pp. 5871-5877.
Bui et al., "Ultrabreathable and Protective Membranes with Sub-5 nm Carbon Nanotube Pores," Advanced Materials, Supporting Information, 2016, pp. 1-15.
International Search Report and Written Opinion from PCT Application No. PCT/US2018/018150, dated Apr. 17, 2018.
Van Der Bruggen, B., "The Separation Power of Nanotubes in Membranes: A Review," ISRN Nanotechnology, vol. 2012, Article ID 693485, 2012, pp. 1-16.
International Preliminary Examination Report from PCT Application No. PCT/US2018/018150, dated Aug. 27, 2019.

* cited by examiner

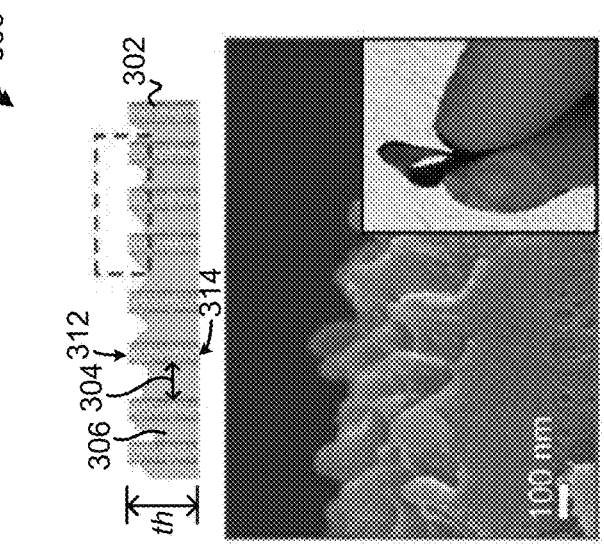
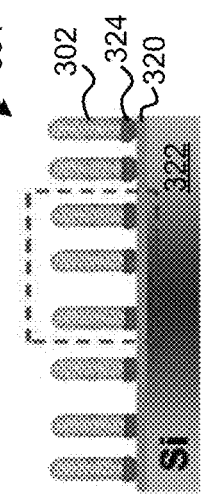
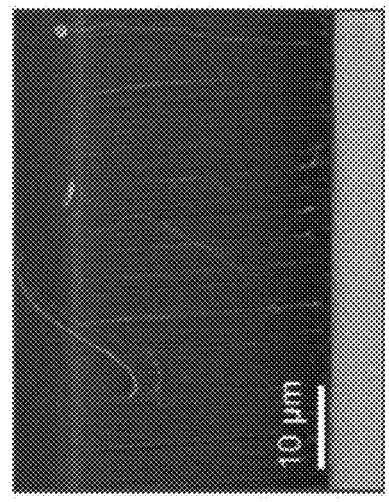
FIG. 3A  FIG. 3B  FIG. 3C
FIG. 3D  FIG. 3E  FIG. 3F

ULTRA-BREATHABLE AND PROTECTIVE MEMBRANES WITH SUB-5 NM CARBON NANOTUBE PORES

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to flexible membranes, and more particularly, this invention relates to ultra-breathable and protective membranes with sub-5 nm carbon nanotube pores.

BACKGROUND

Translation from the nanoscale into macroscale structures of the outstanding thermal, electrical, mechanical, and fluidic properties encountered in many nanomaterials promises to offer new solutions to long-standing challenges in materials science and technology. For membrane applications, materials with properties to overcome the typical trade-off between permeability and selectivity could provide major breakthroughs in several areas, from efficient water purification and energy harvesting, to low-cost separation of high-value chemicals, pharmaceuticals, and biological components.

Recent studies demonstrated that carbon nanotubes (CNTs) enable liquid and gas transport rates within their narrow core that are several orders of magnitude larger than expected for nanopores of similar sizes. Thus, (sub-) nanometer CNT pores have great potential for transforming separation applications if large-scale CNT membranes can be assembled. This ability of CNTs to sustain ultrafast rates of fluid transport is especially promising for the so-far unexplored yet critical field of breathable and protective fabrics. Recent world events, including viral epidemics (Ebola, SARS, avian flu) and the release of chemical warfare agents (sarin, sulfur mustard) in the ongoing Syria conflict, have highlighted the urgency to develop materials that can protect against hazardous agents to ensure the safety of civilian, medical, and military personnel.

To minimize physiological burden and prevent the risk of heat stress, a protective garment also has to allow facile perspiration and efficient heat loss from the body by evaporative cooling. Unfortunately, achieving both high protection and breathability (i.e. rapid water vapor transport) in a single material remains elusive. Current protective materials sacrifice breathability in order to prevent exposure to harmful agents. There are typically either impermeable barriers that entirely block penetration of chemical and biological hazards (but also of water vapor), or heavy-weight laminates containing adsorbents for harmful agents. Conversely, macroporous membranes with high permeability to moisture vapor and air offer poor protection. Indeed, because their ability to protect typically relies on hydrophobicity/oleophobicity, low-tension liquids can penetrate their porous network structure and potentially shuttle in other hazardous components. Furthermore, these macroporous materials are ineffective against vapor-phase threats.

Recent approaches to achieve adequate breathability in protective materials typically encompass selective monolithic membranes made of novel hydrophilic polymers, or multifunctional materials containing chemical groups/oxide nanoparticles with antibacterial or self-decontamination ability. An alternative route with truly transformative potential requires designing/fabricating smart dynamic materials that exhibit a reversible, rapid transition from a breathable state to a protective state triggered by environmental threats. These responsive membranes are expected to be particularly effective in mitigating physiological burden because a less breathable but protective state can be actuated locally and only when needed.

SUMMARY

According to one embodiment, a product includes a plurality of carbon nanotubes and a fill material in interstitial spaces between the carbon nanotubes for limiting or preventing fluidic transfer between opposite sides of the product except through interiors of the carbon nanotubes. Moreover, the longitudinal axes of the carbon nanotubes are substantially parallel, where an average inner diameter of the carbon nanotubes is about 20 nanometers or less. In addition, the ends of the carbon nanotubes are open and the fill material is impermeable or having an average porosity that is less than the average inner diameter of the carbon nanotubes.

According to another embodiment, a product includes a plurality of carbon nanotubes having substantially parallel longitudinal axes and a fill material in interstitial spaces between the carbon nanotubes for limiting or preventing fluidic transfer between opposite sides of the product except through interiors of the carbon nanotubes. Moreover, an average inner diameter of the carbon nanotubes is about 6 nanometers or less, and ends of the carbon nanotubes are open. In addition, the fill material is impermeable or having an average porosity that is less than the average inner diameter of the carbon nanotubes, where a density of the carbon nanotubes is in a range of $10^{11}$ and $10^{13}$ carbon nanotubes per square centimeter.

According to yet another embodiment, a method includes forming a plurality of carbon nanotubes having substantially parallel longitudinal axes and where an average inner diameter of the carbon nanotubes is about 20 nanometers or less, filling interstitial spaces between the carbon nanotubes with a fill material for blocking passage of at least any material through the interstitial spaces having a size greater than the average inner diameter of the carbon nanotubes, and after filling the interstitial spaces, opening ends of the carbon nanotubes.

Other aspects and advantages of the present invention will become apparent from the following detailed description, which, when taken in conjunction with the drawings, illustrate by way of example the principles of the invention.

BRIEF DESCRIPTION OF THE DRAWINGS

FIGS. 3A-3C are schematic drawing of a method to form a membrane according to an exemplary embodiment.

FIG. 3D is a cross-sectional scanning electron micrograph of a CNT forest according to one embodiment.

FIG. 3E is a scanning electron micrograph of a CNT-parylene composite before etching according to one embodiment. FIG. 3E includes an inset of a high magnification of the area in the box.

FIG. 3F is a scanning electron micrograph of the tope surface of the membrane after etching, according to one embodiment. FIG. 3F includes an inset of a photograph of a flexible, free-standing CNT-parylene composite according to one embodiment.

FIG. 6 is a plot of MVTR and corresponding $R_{tot}$ of CNT membranes and commercial breathable fabrics.

FIG. 7 is a plot of single-pore water vapor permeability of a CNT membrane and several porous membranes. Inset is a bar graph of the enhancement factor defined as a ratio of measured to predicted permeability of CNT membrane and several porous membranes.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of ultrabreathable membranes with sub-5 nm carbon nanotube pores and/or related systems and methods.

In one general embodiment, a product includes a plurality of carbon nanotubes and a fill material in interstitial spaces between the carbon nanotubes for limiting or preventing fluidic transfer between opposite sides of the product except through interiors of the carbon nanotubes. Moreover, the longitudinal axes of the carbon nanotubes are substantially parallel, where an average inner diameter of the carbon nanotubes is about 20 nanometers or less. In addition, the ends of the carbon nanotubes are open and the fill material is impermeable or having an average porosity that is less than the average inner diameter of the carbon nanotubes.

In another general embodiment, a product includes a plurality of carbon nanotubes having substantially parallel longitudinal axes and a fill material in interstitial spaces between the carbon nanotubes for limiting or preventing fluidic transfer between opposite sides of the product except through interiors of the carbon nanotubes. Moreover, an average inner diameter of the carbon nanotubes is about 6 nanometers or less, and ends of the carbon nanotubes are open. In addition, the fill material is impermeable or having an average porosity that is less than the average inner diameter of the carbon nanotubes, where a density of the carbon nanotubes is in a range of $10^{11}$ and $10^{13}$ carbon nanotubes per square centimeter.

In yet another general embodiment, a method includes forming a plurality of carbon nanotubes having substantially parallel longitudinal axes and where an average inner diameter of the carbon nanotubes is about 20 nanometers or less, filling interstitial spaces between the carbon nanotubes with a fill material for blocking passage of at least any material through the interstitial spaces having a size greater than the average inner diameter of the carbon nanotubes, and after filling the interstitial spaces, opening ends of the carbon nanotubes.

A list of acronyms used in the description is provided below.

ALD atomic layer deposition
Au gold
$cm^{-1}$ per centimeter
CMP chemical mechanical planarization
CNT carbon nanotube
DMPC dynamic moisture permeation cell
ePTFE expanded polytetrafluoroethylene
Fe/Mo iron/molybdenum
mL millilitre
MPa megapascal
MVTR moisture vapor transport rate
nm nanometer
qRT-PCR quantitative reverse transcription-polymerase chain reaction
RH relative humidity
$R_{BL}$ boundary layer resistance
$R_{CNT}$ resistance of CNT membranes
$R_{ePTFE}$ resistance of ePTFE membranes
$R_{tot}$ total resistance
SARS Severe Acute Respiratory Syndrome
SEM scanning electron microscopy
SWNT single walled nanotubes
TEM transmission electron microscopy
UV ultraviolet There is a need for protective yet breathable adaptive garments. Various embodiments described herein include a chemical threat responsive membrane based on two components: a highly breathable CNT-membrane that provides an effective barrier against biological threats; and a thin responsive functional layer grafted or coated on the membrane surface that either closes the CNT pore entrance upon contact with a chemical warfare agent or self-exfoliates in the region of contamination after neutralizing the threat.

Various embodiments described herein demonstrate fabrication of a flexible membrane with aligned, sub-5 nm CNT channels as moisture conductive pores. In some approaches, the membranes described below provide rates of water vapor transport that surpass those of commercial breathable fabrics, even though the CNT pores are only a few nm wide and the overall porosity may be less than 5.5%. Moreover, the membranes described herein may be fabricated over a large area in the dimensions of as large as several $m^2$.

Furthermore, quantifying the single-pore permeability to water vapor enables benchmarking the performance of these materials when a concentration gradient is used as a driving force. CNT nanochannels may sustain gas-transport rates exceeding Knudsen diffusion theory by more than one order of magnitude.

In addition, various embodiment demonstrate complete rejection of 2 nm charged dyes, 5 nm uncharged gold (Au) nanoparticles, and about 40-60 nm Dengue virus from aqueous solutions during filtration tests. Thus, some embodiments described herein demonstrate effective protection from biological threats by size exclusion rather than by merely preventing wetting.

Figure 1:
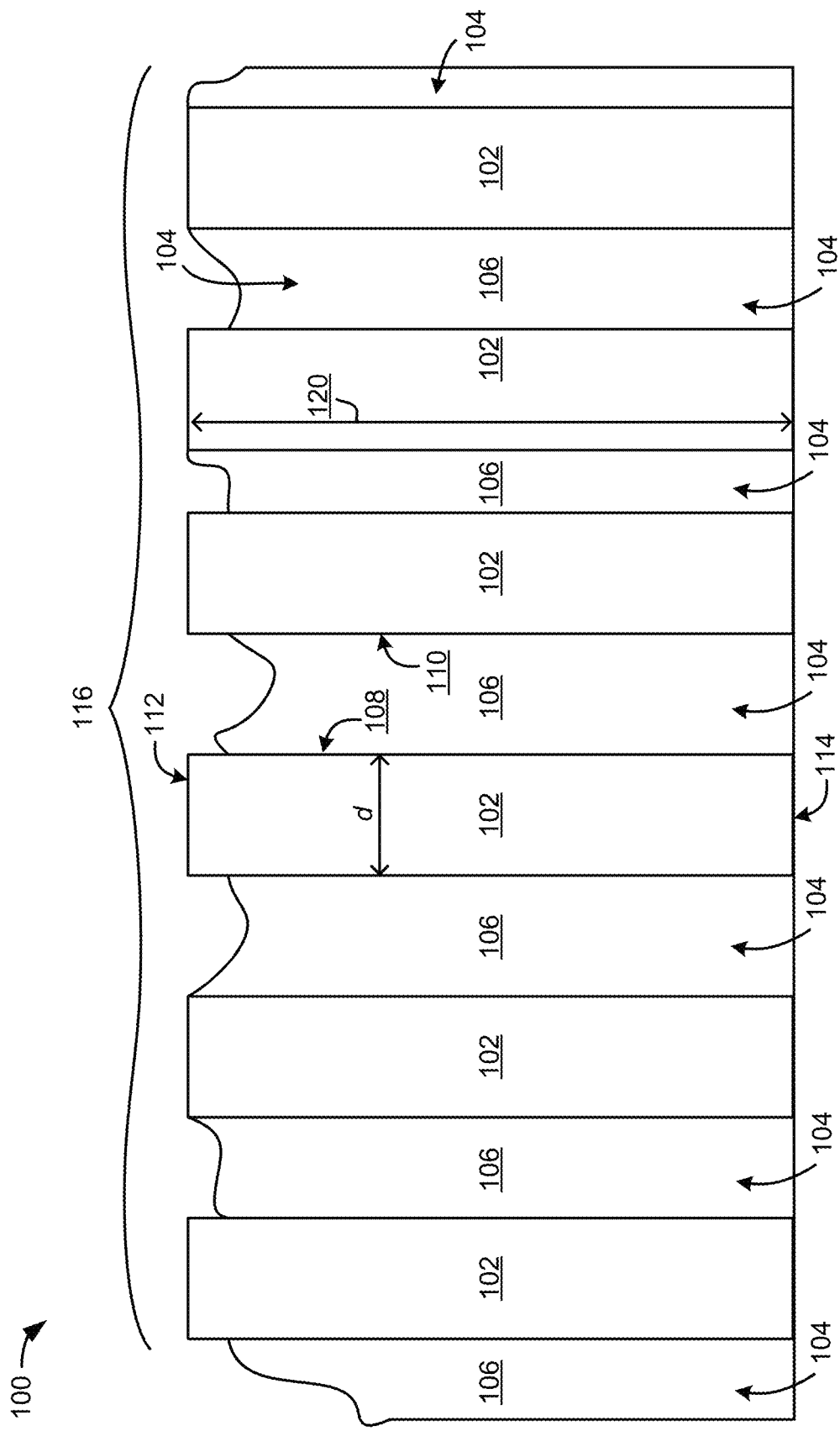
FIG. 1 is schematic drawing of a membrane according to one embodiment.

FIG. 1 depicts a product 100 for an ultra-breathable and protective membrane, in accordance with one embodiment. As an option, the present product 100 may be implemented in conjunction with features from any other embodiment listed herein, such as those described with reference to the other FIGS. Of course, however, such product 100 and others presented herein may be used in various applications and/or in permutations which may or may not be specifically described in the illustrative embodiments listed herein. Further, the product 100 presented herein may be used in any desired environment.

According to one embodiment illustrated in FIG. 1, a product 100 includes a plurality 116 of CNTs 102 having sidewalls 108, 110, and a fill material 106 in interstitial spaces 104 between the CNTs 102 for limiting or preventing fluidic transfer between opposite sides of the product except through interiors of the CNTs 102. Moreover, longitudinal axes 120 of the CNTs 102 may be substantially parallel. For example, the CNTs may form a "forest" of CNTs and the forest may cover the area of the thickness of the membrane.

In various embodiments, the sidewalls of the CNTs may be primarily one carbon atom thick, but could be higher, e.g., 2 or more atoms thick.

The average inner diameter d of the CNTs 102 may be about 20 nanometers or less, where the average inner diameter d may be the average considering all, or a large sampling, of the CNTs 102 in an array 116 (rather than a diameter d along the longitudinal axis 120 of each CNT 102). In some approaches, the inner diameter d may be about the same as the outer diameter. In other approaches, the average inner diameter d of the CNTs 102 may be less than about 6 nanometers. In yet other approaches, the average inner diameter d of the CNTs 102 may be less than about 4 nm. In yet other approaches, the average inner diameter d of the CNTs 102 may be greater than about 1 nm.

According to one embodiment of product 100, the ends 112, 114 of the CNTs 102 may be open. Furthermore, the fill material 106 may be impermeable to anything, or impermeable to anything other than water vapor. In further approaches, the fill material 106 may have an average porosity that is less than the average inner diameter d of the CNTs 102. In other approaches, the fill material 106 may exclude chemicals based on a mechanism other than size exclusion. For example, but not limited to, the fill material may block chemicals that are not soluble in the filling material even though the size of the chemical may be similar to the size of water vapor.

In some embodiments, the fill material 106 may be permeable. In some approaches, the fill material is permeable for water vapor, where the fill material may be impermeable to chemicals and molecules, for example but not limited to biologicals (e.g., pathogens, pollen, spores, etc.), which typically have a size larger than a water molecule.

In other embodiments, the fill material may be selectively permeable, being permeable for water vapor, while providing a chemical barrier to chemicals and/or biologicals, e.g., as in the following examples. In some approaches the fill material may have selective permeability properties that include low permeability to chemicals (e.g., less than 10% permeability), for example a low solubility, a low diffusivity, or a combination of both thereof. In other approaches, the fill material may react with the chemicals and neutralize the chemical activity. In yet other approaches, the fill material may block chemicals and/or biologicals of interest altogether, while being permeable for water vapor.

The fill material 106 may be constructed of any suitable material that would become apparent to one skilled in the art reading the present disclosure. In some approaches, the fill material may be polymeric. In other approaches, the fill material may be ceramic.

In various embodiments, the density of the CNTs 102 is in a range of $10^{11}$ and $10^{13}$ CNTs per square centimeter, for example, the CNTs may form a forest of CNTs that cover the entire thickness of the membrane.

In various embodiments, transport of gas and/or liquid occurs through the CNTs. In some approaches, water vapor transport through the single-walled nanotubes (SWNTs) of the CNT membrane may be driven by a relative humidity gradient. In other approaches, the CNT membranes with <5 nm conductive pores may exhibit outstanding moisture vapor transport rates (MVTR), for example but not limited to MVTR approaching 8000 g/m²d while rejecting ≥5 nm analytes by size exclusion.

In various embodiments, a concentration gradient may be used as a driving force such that CNT nanochannels in the membranes may sustain gas-transport rates that exceed Knudsen diffusion theory (as discussed further below) by more than one order of magnitude. Furthermore, the CNT membranes may provide rates of water vapor transport that surpass conventional breathable fabrics, even though the CNT pore size of the CNT channels may be only a few nm wide and the overall porosity in a range of greater than 0 to 15%, and preferably in the range of about 1% to about 5%.

Moreover, the CNT pores may be narrow and may block biological threats like viruses and bacteria by size exclusion.

Figure 2:
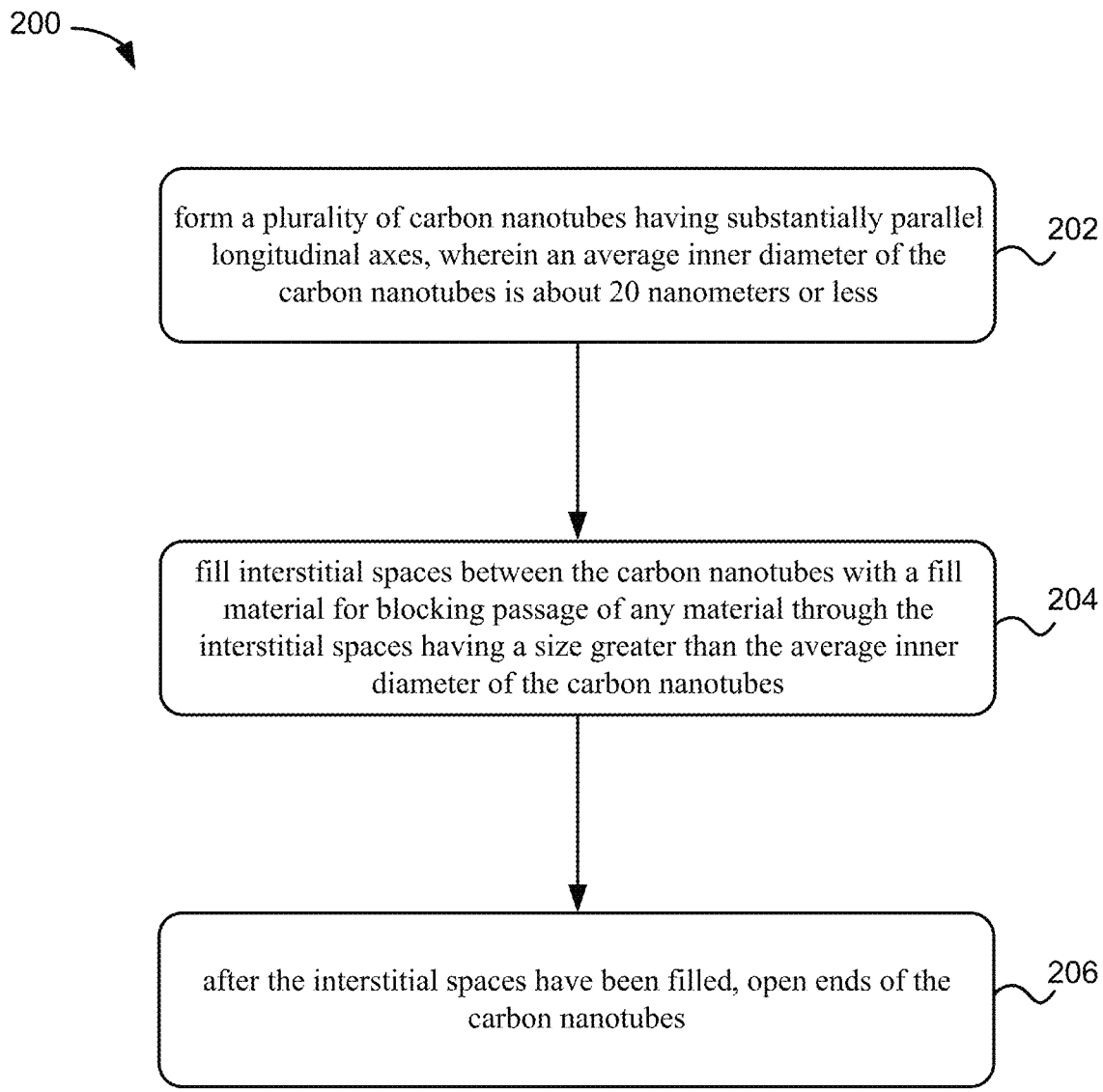
FIG. 2 is a flowchart of a method according to one embodiment.

FIG. 2 shows a method 200 for forming a plurality of CNTs, in accordance with one embodiment. As an option, the present method 200 may be implemented for forming products such as those shown in the other FIGS. described herein. Of course, however, this method 200 and others presented herein may be used to form a structure which may or may not be related to the illustrative embodiments listed herein. Further, the methods presented herein may be carried out in any desired environment. Moreover, more or less operations than those shown in FIG. 200 may be included in method 200, according to various embodiments. It should also be noted that any of the aforementioned features may be used in any of the embodiments described in accordance with the various methods.

According to one embodiment as shown in the diagram in FIG. 2, method 200 begins with step 202 of forming plurality of CNTs having substantially parallel longitudinal axes, where an average inner diameter of the CNTs may be in a range of about 20 nanometers to greater than about 1 nm.

Known techniques may be used to form the plurality of CNTs. In some embodiments, the method to grow the CNTs may involve a single metal catalyst layer, for example but not limited to iron (Fe), cobalt (Co), nickel (Ni), platinum (Pt), etc. In other embodiments, the method to grow the CNTs may involve a bimetallic catalyst layer, for example, but not limited to Co-molybdenum (Co—Mo), Fe—Mo, Ni—Mo, Fe—Co, Co-copper (Co—Cu), etc.

In various embodiments, CNTs may be grown as a forest of CNTs on a large scale, for example, wafer scale of 4 to 6 inches. In some approaches, the CNT forests may be grown on a larger scale. In other approaches, the CNTs may be grown on a smaller scale. The area of the CNT forest may depend on the size limit of the growth chamber and the substrate.

In various embodiments, the height of the CNTs may be grown in the range of about 1 µm to about 1 mm or more in vertical height. In some embodiments, the CNTs may grow to about 20 to 30 µm in height.

FIGS. 3A-3F show an exemplary embodiment of method 200. A schematic representation of step 202 is shown in FIG. 3A in which vertically aligned CNT 302 forests 301 may be synthesized from an Fe/Mo catalyst layer 324 on a substrate 322, that may be a silicon wafer, using atmospheric-pressure chemical vapor deposition with ethylene as the carbon source. FIG. 3D shows a scanning electron micrograph (SEM) image of a cross-section of a CNT forest 301 (represented by the dashed square of FIG. 3A), according to one embodiment.

In some approaches, the diameter of the CNTs may be tuned according to the size of the particles with which the CNTs are grown. For example, larger particles may result in larger diameter tubes, and smaller particles may result in smaller diameter tubes. In other approaches, the diameter of the CNTs may be tuned according to the amount of carbon added to the growing step. For example, if the particles are starved of carbon, then smaller CNTs may be fabricated, but if a higher amount of carbon is added, then larger CNTs may be fabricated.

Figure 4A:
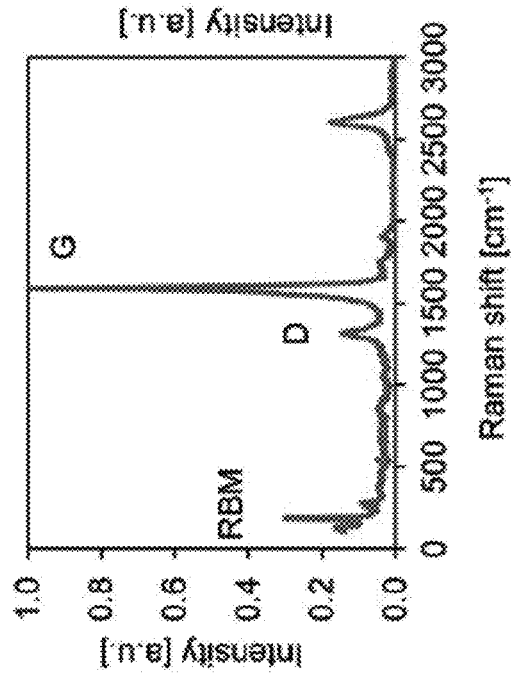
FIG. 4A is a plot of CNT diameter distribution measured from high-resolution TEM images of a CNT forest, according to one embodiment.

FIG. 4A shows a high-resolution transmission electron microscopy (TEM) analysis of CNTs formed as described in step 202 of method 200, according to one embodiment. Analysis shows that the CNTs are SWNTs with diameters in the range of 1-5 nm (3.3 nm average). In addition, these pore sizes (1-5 nm) are smaller than typical dimensions of viruses and bacteria and thus, the CNTs may block biological threats.

Figure 4B:
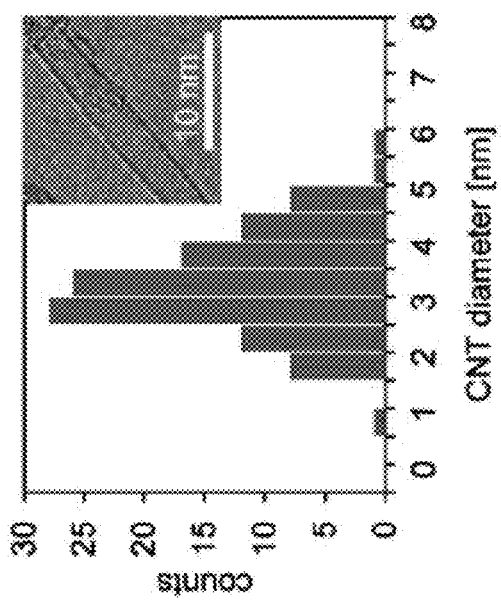
FIG. 4B is plot of Ramen spectroscopy of a typical SWNT forest, according to one embodiment.

The graph in FIG. 4B confirms the presence of small-diameter tubes formed by the CNT fabrication process (step 202 of method 200, FIG. 2) by Raman spectroscopy analysis. The graph of Raman spectroscopy shows sharp radial breathing modes (RBM) of intensity (y-axis) in the 100 to 300 $cm^{-1}$ wavenumber region (x-axis). The measured peak intensity ratios of G-band (at about 1590 $cm^{-1}$) and D-band (at about 1310 $cm^{-1}$) are high and typically in the range of 5-10, thus confirming the high graphitization of fabricated CNT channels.

The density of CNTs in the membrane may correlate with the size of the CNTs. For example, smaller tubes may generate a higher density membrane.

Looking back to FIG. 2, step 204 of method 200 involves filling interstitial spaces between the CNTs with a fill material for blocking passage of any material through the interstitial spaces having a size greater than the average inner diameter of the CNTs. In various embodiments, the fill material may be any polymer that can infiltrate a CNT forest and has at least one of the following characteristics: non-permeable to chemicals and/or biological threats, permeable with water vapor or liquid, and depositable with vapor phase deposition. For example, but not limited to, in the application of the membrane as breathable fabric, a fill material that blocks any unwanted chemicals or bio-molecules, regardless of size, as well as liquid water may be preferable. For other applications, for example, water purification, a porous fill material may be preferable.

In a preferable embodiment, the fill material may be flexible, e.g., resiliently deformable. For example, if the membrane is used in a breathable fabric, a flexible fill material is preferred. In other approaches where the membrane may be used as a type of shield on a building or device, the fill material may be rigid and/or hard in the final form.

Examples of fill material may include polymers, for example, parylenes, polyurethanes, polyamides, epoxy, etc; ceramics; nitrides, for examples, silicon nitride ($Si_3N_4$); metal oxides, for example titanium oxide ($TiO_2$), etc.; oxides of metalloids, for example, silicon oxide ($SiO_2$), etc.; etc. Examples of selectively permeable fill material that allows some water vapor permeability but provides a chemical barrier to chemicals (e.g. unwanted chemical warfare agents) and/or biologicals, regardless of size, may include polymers such as polyamines, sulphonated polymers, polymers containing fluorinated sulphonic acides, Chitosan, polyvinyl alcohol, polyalkylene-imine, etc.

In various embodiments, methods to fill the interstitial spaces between the CNTs as described by step 202 of method 200 may include atomic layer deposition (ALD), initiated chemical vapor deposition, polymer melting, spin-coating, dipping, etc. and combinations thereof.

FIG. 3B shows a schematic representation of step 204 (FIG. 2), according to an exemplary embodiment, in which the interstitial spaces 304 surrounding the CNT 302 may be filled with parylene-N material 306 by conformal coating from the vapor phase under vacuum and at room temperature, according to an exemplary embodiment. FIG. 3E shows a SEM image of a CNT-parylene composite 326 (represents the dashed square of FIG. 3B) following infiltration of the CNT 302 forests with parylene-N material 306, according to an exemplary embodiment. The high magnification SEM image inset (100 nm) of FIG. 3E shows a good conformal coating of the CNTs 302 after polymer deposition (for example, parylene-N material 306). The SEM image of the surfaces (top third portion of FIG. 3E) and cross sections (bottom two-thirds portion of FIG. 3E) of the CNT-parylene composite 326 shows efficient filling of the gaps (interstitial spaces 304) between CNTs 302 by the polymeric matrix (for example, parylene-N material 306) while maintaining vertical alignment of the native CNT forests 301 (FIG. 3D).

Efficient polymer infiltration (as shown in FIG. 3B) not only may ensure fluidic transport occurs through the inner core of the CNT nanochannels, but also the resulting CNT-parylene composites may display mechanical properties that are important for the application of the membranes as garment components. For example, various embodiments of fabrication of CNT-parylene composites show relatively high tensile strength (about 9±3 MPa) and elastic modulus (about 382±190 MPa).

Looking to FIGS. 3A and 3B, the CNTs may be formed on a release layer 320. In various embodiments, the release layer 320 may include material that may be dissolved by treatment with acid or base, for example alumina, oxides, etc. The CNT forests 301 infiltrated with fill material 306 may be released from the substrate 322 by dissolving the release layer 320 in acid or base, depending on the material of the release layer.

Referring back to FIG. 2, step 206 of method 200 involves opening ends of the CNTs. In various embodiments, the process to open the ends of the CNTs may be appropriate to the type of infiltrating material, for example but not limited to, etching, dissolution, lapping by process such as chemical mechanical planarization (CMP), etc.

FIG. 3C shows a schematic representation of step 206 (FIG. 2), according to an exemplary embodiment, in which the CNT-parylene composite 326 of FIG. 3B may be released from the substrate 322 (silicon wafer) by soaking in an acidic solution. Methods to remove excess parylene and to open the CNT 302 tips on either end 312, 314 may include reactive ion etching, air-plasma treatment, etc. The resulting structure 300 as shown in FIG. 3C may be a CNT-parylene composite that includes CNTs 302 with parylene-N material 306 infiltrated in the interstitial spaces 304 between the CNTs 302.

FIG. 3F shows a SEM image of the top portion of the CNT-parylene composite 300 as represented by the dashed square in FIG. 3C. The inset of FIG. 3F shows a photograph of a flexible, free-standing CNT-parylene composite 300, according to one embodiment.

Figure 4C:
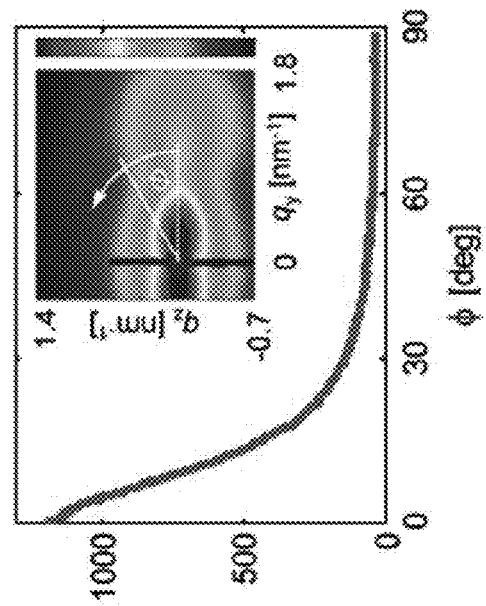
FIG. 4C is an example of an azimuthal profile of X-ray scattering intensity used to quantify CNT tortuosity.

In various embodiments as shown, for example, in FIG. 3C, the CNTs 302 of the CNT-parylene composite 300 may function as low-tortuosity fluidic conduits, through the individual CNTs 302 that span the entire membrane thickness th. In other words, there is a low level of curvature (or tortuosity) of the path fluid may follow when entering the open top end 312, spanning the thickness th of the membrane, and exiting the open bottom end 314. For example, as shown in FIG. 4C, the tortuosity (r=1.25) of the CNTs was quantified from the anisotropy of the small-angle X-ray scattering pattern along the azimuthal angle $\phi$, which was collected with the incident X-ray beam orthogonal to the vertically aligned forest 301.

EXPERIMENTAL

Fabrication of CNT Membranes

Briefly, 20-30 μm tall vertically aligned CNT forests were synthesized from a 5.5/0.5 Å Fe/Mo catalyst layer on a silicon (100) wafer using atmospheric-pressure chemical vapor deposition with ethylene as the carbon source. CNT interstitial spaces were then filled with parylene-N via conformal coating from the vapor phase under vacuum and at room temperature. The CNT-parylene composite films were released from the silicon wafer by soaking in a 37 wt % aqueous HCl solution overnight and then mounted on a polyester plastic film with a punched hole of 1.5 cm diameter. To remove the excess parylene-N covering the CNT tips and open the CNTs to fluid flow, reactive ion etching was used followed by a milder air-plasma treatment.

Density of CNT Forests with and without Parylene Infiltration

Various methods may be performed to determine the density of the CNTs 302 in the forest 301 as formed in step 202 (FIG. 2, FIG. 3A). The weight gain method following conventional techniques measures a mean density calculated from a volumetric mass density of the CNTs, the height of the forest measured by SEM, and the silicon support area under the forest. Synchrotron X-ray attenuation measures the mass density of the CNT forest by measuring the X-ray intensity of scattering upstream and downstream of the sample, and then using these values to calculate the CNT forest mass density based on the Beer-Lampert law following conventional techniques. Using these two methods, the CNT forest density has been calculated to be $5.2 \times 10^{11}$ CNT/cm for weight gain, and $5.1 \times 10^{11}$ CNT/cm for X-ray attenuation.

A third method, KCl diffusion, measures the density of open CNT pores after parylene infiltration and membrane surface etching. In these KCl diffusion studies, the CNT forest density was calculated to be $6.5 \times 10^{11}$ CNT/cm$^2$, which compares closely with the density measurement using the weight gain method and the synchrotron X-ray attenuation measurements. All three density values correspond to a porosity of 4.4% to 5.5%.

Transport Across CNT Membranes

Figure 5A:
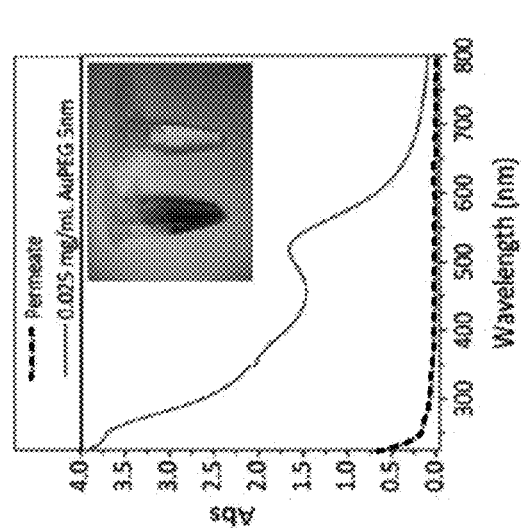
FIG. 5A is UV-vis spectra (plot) and optical images (inset) of $K_3FeCN_6$ feed and permeate solutions after filtration through a CNT membrane.
Figure 5B:
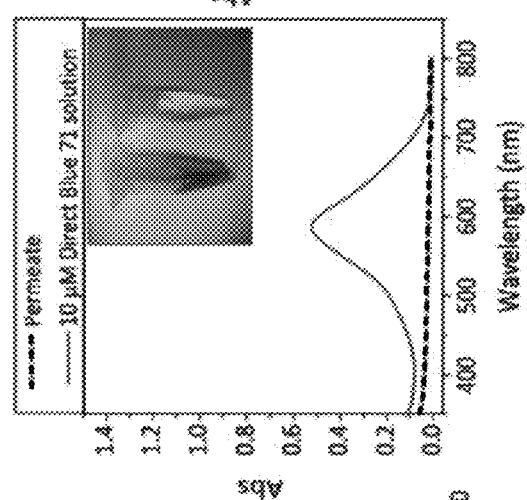
FIG. 5B is UV-vis spectra (plot) and optical images (inset) of Direct Blue 71 nanoparticle feed and permeate solutions after filtration through a CNT membrane.
Figure 5C:
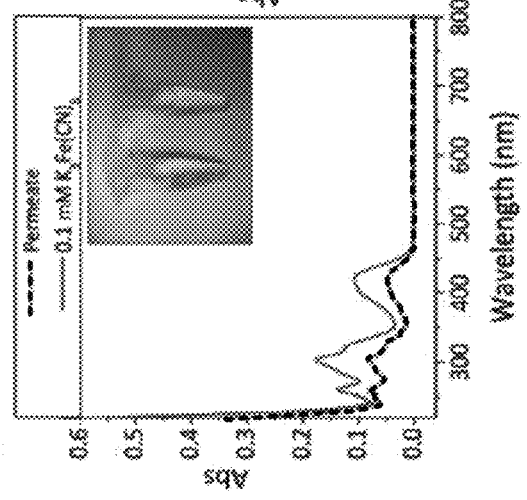
FIG. 5C is UV-vis spectra (plot) and optical images (inset) of nAu5 gold nanoparticle feed and permeate solutions after filtration through a CNT membrane.

The CNT membranes were challenged to filter out a series of molecules having different sizes and charges in order to demonstrate transport across the membranes occurs through the CNT pores. FIGS. 5A-5C show three different sized and charged molecules tested to transport through the CNT membranes: FIG. 5A shows potassium ferricyanide ([Fe(CN)$_6$]$^{3-}$ anion, size about 0.95 nm), FIG. 5B shows a larger negatively charged dye (Direct Blue 71, size 3×1.5×1 nm$^3$), and FIG. 5C shows a neutral polyethylene glycol (PEG)-coated Au nanoparticles ("nAu5," size 5 nm). Ultraviolet-visible (UV-vis) spectroscopy shows a reduction in [Fe(CN)$_6$]$^{3-}$ concentration by about 55% in the permeated solution (dotted line, FIG. 5A), and the slight changes are observed in the inset showing the left tube with [Fe(CN)$_6$]$^{3-}$ feed solution and the right tube with permeate solution.

The negatively charged molecules (Direct Blue 71, FIG. 5B) and the larger particles of PEG coated Au (FIG. 5C) each show an absence of detectable peaks in the permeate UV-vis spectra (dotted lines on the plots), and permeates in the tubes (right tubes in the insets) do not contain the color of the feed solutions (left tubes in inset). Thus, there appeared to be a complete rejection of feed solutions during filtration through the CNT membranes as shown in FIGS. 5B and 5C.

Overall there appeared to be both steric and electrostatic effects that contributed to the membrane selectivity. Since the diameters of the CNT pores are significantly wider than the molecular size of [Fe(CN)$_6$]$^{3-}$, the partial rejection of the molecules seemed to be attributed to electrostatic interactions between the negatively charged carboxylic groups at the tube entrance and the anions in solution. Similarly, even though the dimensions of the Direct Blue 71 molecule fall within the CNT diameter distribution, complete dye exclusion may have been achieved because of the contribution of the electrostatic interactions. Finally, since nAu5 does not carry a charge, its rejection may be due exclusively to steric effects, i.e. size exclusion. All of these filtration results suggest that transport occurs through the CNT pores. Moreover, the exclusion of uncharged species with sizes just above the upper bound of the CNT diameter distribution suggests that garments incorporating these membranes may protect against viruses and bacteria by size exclusion.

Figure 5D:
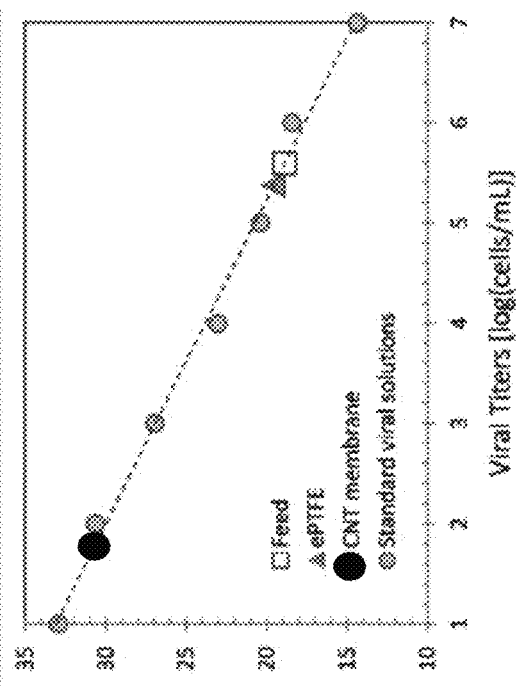
FIG. 5D includes scanning electron micrograph images (left) of a CNT membrane and an ePTFE membrane after filtration of Dengue virus solution, optical images (middle and right) of culture plates from plaque assay analysis of feed viral solution and permeate.
Figure 5E:
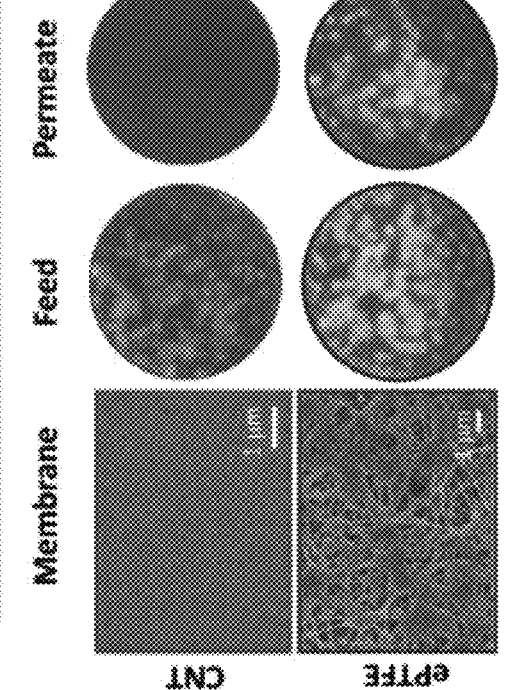
FIG. 5E is a plot of the qRT-PCR analysis of filtration of Dengue virus solution through CNT membrane and ePTFE membrane.

FIGS. 5D and 5E show CNT membranes can block biological threats. In FIG. 5D, an aqueous solution of about 40 to 60 nm Dengue virus was filtered through a CNT membrane. Both quantitative polymerase chain reaction (qRT-PCR) and the plaque assay were employed to test the penetration of viral particles across the membrane to the permeate side. The plaque assay (FIG. 5D) revealed that CNT membrane permeate was free of infectious virus as indicated by the absence of plaque (white particles) in the culture dish of the optical image (top right circle). The qRT-PCR measurements (FIG. 5E) confirmed these findings by showing a four-log decrease in viral RNA concentration on the permeate side after filtration, <2 log(cells/mL) (CNT membrane) compared to the levels in the beginning solution, nearly 6 log(cells/mL) (Feed).

In sharp contrast, when the virus filtration challenge was repeated for a reference macroporous membrane made of highly breathable expanded polytetrafluoroethylene (ePTFE), Dengue virus penetrated freely through the membrane as shown in FIG. 5D, bottom row, with viral plaques (white particles) in both the feed and permeate and in FIG. 5E with viral titres of ePTFE (solid triangle) at levels similar to the feed, approximately 5-6 log(cells/mL). Thus, the ePTFE membrane provides little protection from biological hazards due to its open macroporous structure.

Vapor Transport Across CNT Membranes

To allow efficient evaporative cooling of a the body through perspiration, a protective ensemble must provide a moisture vapor transport rate (MVTR) greater than 1500 to 2000 g/m² day. For CNT membranes, breathability was measured with the dynamic moisture permeation cell (DMPC) method, in which purely diffusive steady-state transport of water vapor was established by exposing each membrane side to a gas stream with a different relative humidity (RH). From experimental MVTR and the average water-vapor concentration difference across the membrane $\Delta C$, the corresponding total resistance to moisture vapor transport was calculated, $R_{tot}=\Delta C/MVTR$.

Figure 6:
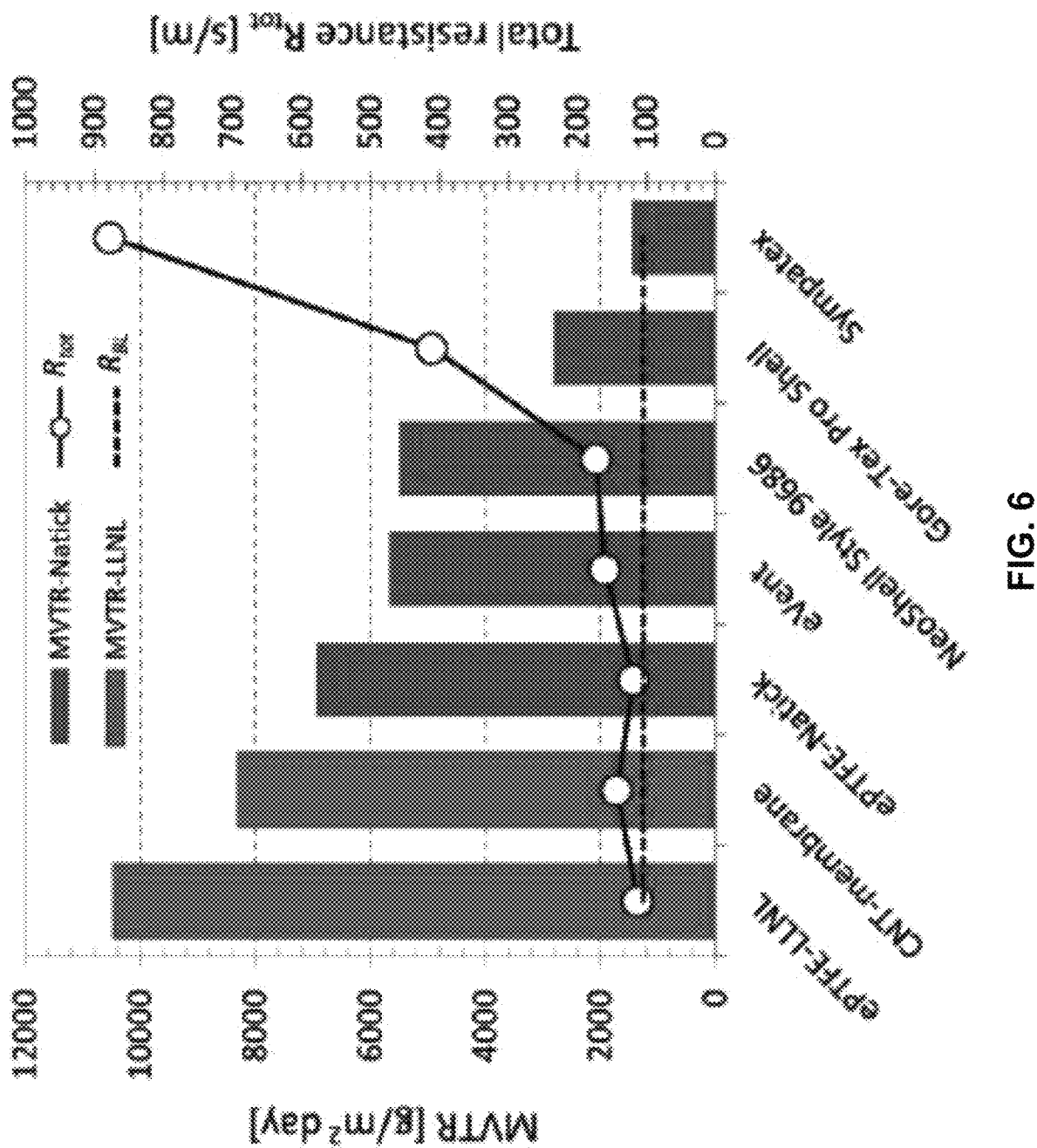

In FIG. 6, the measurements of MVTR (bars, left y-axis) and $R_{tot}$ (open circles, right y-axis) for CNT membranes and commercial breathable fabrics are compared, including macroporous films (ePTFE, eVent, NoeShell) or dense polymer laminates (Gore-Tex, Pro Shell, Sympatex). All samples were measured at 30° C. and at a mean RH=30% for an incoming gas stream humidity difference $\Delta RH=50\%$. Data for CNT membranes and ePTFE films were collected with 1-2 cm² area samples, while the data of the remaining fabrics were measured with 25 cm² area samples. Because of the intrinsically different transmembrane $\Delta C$ stemming from the difference in active membrane area, results are best compared in terms of $R_{tot}$. The black dashed line represents the boundary layer resistance $R_{BL}$.

At these conditions, the $R_{tot}$ for CNT membrane (resistance to water vapor transport) was comparable or smaller than $R_{tot}$ for conventional breathable fabrics (open circles graph of FIG. 6).

In particular, looking at the bar graph of FIG. 6, CNT membranes provided MVTR close to 8000 g/m² day, i.e., fourfold larger than the breathability target. Notably this transport rate approaches that of macroporous ePTFE in spite of the much smaller porosity (<5.5% vs about 64%) and average pore size (3.3 nm vs about 210 nm).

Single Pore Water Vapor Permeability

The DMPC method measures the total resistance to water vapor diffusion ($R_{tot}$), including the contribution of resistances ($R_{BL}$) due to the air-side boundary layer at the two membrane surfaces. To benchmark the performance of CNT pores against various porous materials, the intrinsic mass transport properties of the CNT membranes ($R_{tot}$) was obtained by accounting for $R_{BL}$ which is membrane-independent and was obtained from the y-intercept in a linear plot of $R_{tot}$ versus membrane thickness. In this case, the $R_{BL}$ was obtained using ePTFE membranes by stacking a different number (1, 5, 10, and 15) of identical layers, each about 18 μm thick. Application of a resistance-in-series model allowed extracting the magnitude of all resistances ($R_{BL}$=104.5 s/m, $R_{ePTFE}$=5 s/m, and $R_{CNT}$=38.5 s/m) and revealed a large contribution of the external air-side resistance to the total measured breathability.

Figure 7:
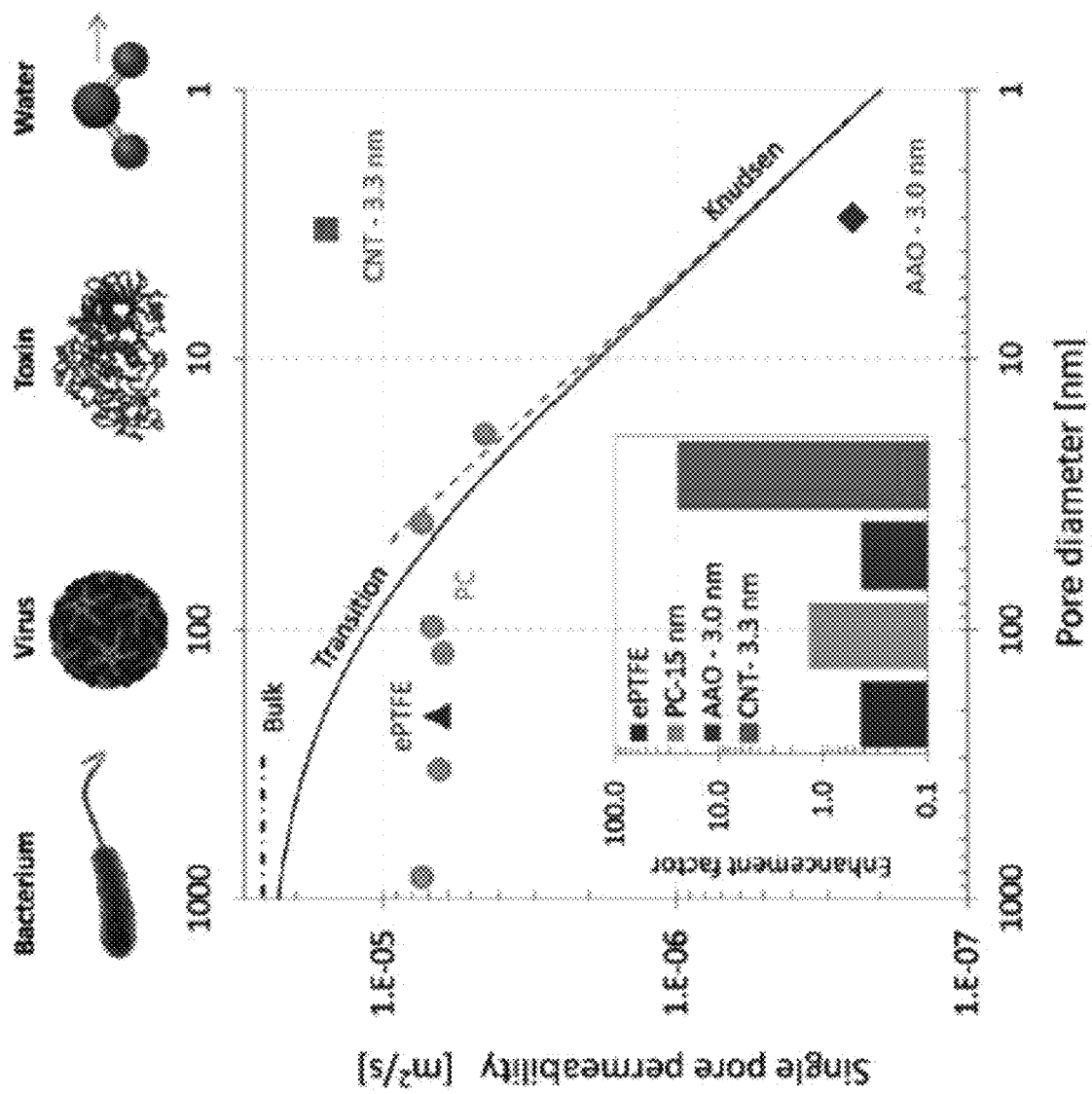

FIG. 7 shows a breathability/protection quality plot for porous materials using the knowledge of the intrinsic membrane properties for water vapor transport. The plot represents the water vapor permeability of a single pore as a function of its diameter. As shown in the plot, for the small pores, the predicted transport rate using the Knudsen diffusion equation is shown by the dashed line. For intermediate pores, the predicted transport rate using the transition regime diffusivity equation is shown by the solid line. For large pores, the predicted transport rate using the bulk diffusion equation is shown by the dotted-dashed line.

The single pore permeability for several porous membranes (polycarbonate, PC=circle, ePTFE=triangle, anodic aluminum oxide, AAO=diamond, CNT, CNT=square) were obtained with the DMPC method at 30° C. with average RH=30% and an incoming gas stream humidity difference of 50%. The inset of FIG. 7 shows the enhancement factor defined as ratio of measured to predicted permeability. On the upper x-axis of the plot are the typical dimensions, in nm, of biological threats.

FIG. 7 shows that these gas diffusion theories predict with good accuracy (within a factor of 3) the magnitude of the transport rates for conventional membranes (the points are close to the predicted lines), whereas the permeability of the CNT channels is 24 times larger than Knudsen diffusion predictions (dashed line) and comparable to bulk diffusivities (dotted-dashed line)(about 0.16 cm²/s in the CNTs vs 0.26 cm²/s in the bulk).

Without wishing to be bound by any theory, the inventors believe this plot shows enhanced gas-transport in CNTs driven by a concentration gradient. Molecular dynamics (MD) simulations predicted diffusivities approaching bulk diffusion for pure gases like $H_2$, $CH_4$, Ne, Ar, $N_2$, and $CO_2$ inside a CNT and also showed that the Fickian diffusivities in a $CH_4/H_2$ gas mixture transporting through a CNT are close to that of their pure-component counterparts. This enhancement may be explained with the intrinsic atomic smoothness of well-graphitized CNT walls.

More specifically, in the Knudsen regime, molecule-surface collisions dominate over molecule-molecule collisions and dictate the magnitude of gas transport. Knudsen diffusion assumes diffusive scattering after a molecule-wall collision. However, if the inner surface of a pore instead of being rough (such as in a typical ceramic or polymeric membrane) is atomically smooth (such as in a CNT), the nature of the gas-wall collisions shifts from purely diffusive to a combination of diffusive and specular collisions. In addition, for a pore with a very smooth potential energy surface such as a CNT, the energy required to move an adsorbed gas molecule along the pore wall is very small. Thus, gas diffusivities in CNTs are much larger than estimated by Knudsen diffusion and found in other nanoporous materials with comparable pore dimensions.

CNTs may have an enhancement of water vapor transport over Knudsen theory with a magnitude approaching that measured for pure gasses under a pressure gradient. To confirm this expectation, the mass transport rate of nitrogen was quantified in the SWNTs under a pressure gradient. The about 23 μm thick CNT-composite membranes were measured to have a nitrogen permeance of $1.81\pm0.36\times10^{-5}$ mol/m² sPa, which was about 50 times larger than predictions based on Knudsen diffusion theory. Thus, without wishing to be bound by any theory, the inventors believe that the high breathability of the CNT membranes may be attributed to the smoothness of the SWNT pores.

Liquid Flow Transport Rates

The water permeability of CNT membranes was quantified under hydraulic pressure gradient. For dilute aqueous solutions, a liquid permeance of $42.5\pm17.3$ L/m² hbar was found based on total membrane area which corresponded to an enhancement factor of $214\pm93$ with respect to the Hagen-Poiseuille equation. In addition to demonstrating fast flow, this enhancement factor suggested that transport measured across the CNT membranes may occur through the CNT pores rather than through nm sized gaps in the polymer matrix.

In use, incorporation of CNTs in flexible polymeric matrices as selective, moisture-conductive pores may be used in protective fabrics for applications in both civilian (for example, first response and clean-up missions, hospitals, etc.) and military settings (for example, protection from chemical warfare agents).

Ultrabreathable and protective CNT membranes described herein may also be useful in separation processes, such as membrane distillation, pervaporation, water purification and desalination.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A product, comprising:
a plurality of carbon nanotubes; and
a fill material in interstitial spaces between the carbon nanotubes for limiting fluidic transfer between opposite sides of the product except through interiors of the carbon nanotubes,
wherein longitudinal axes of the carbon nanotubes are substantially parallel,
wherein an average inner diameter of the carbon nanotubes is about 20 nanometers or less,
wherein ends of the carbon nanotubes are open,
wherein the fill material is permeable to water vapor,
wherein the fill material is configured to prevent penetration of chemicals and biologicals having a size larger than a water molecule into the fill material by size exclusion.

2. The product as recited in claim 1, wherein sidewalls of the carbon nanotubes are primarily one atom thick.

3. The product as recited in claim 1, wherein the average inner diameter of the carbon nanotubes is less than about 6 nanometers, wherein the fill material comprises pores having an average diameter of less than 6 nanometers.

4. The product as recited in claim 1, wherein the average inner diameter of the carbon nanotubes is less than about 4 nanometers.

5. The product as recited in claim 1, wherein the fill material has an average porosity that is less than the average inner diameter of the carbon nanotubes.

6. The product as recited in claim 1, wherein the fill material is reactive with the chemicals.

7. The product as recited in claim 1, wherein the fill material is polymeric.

8. The product as recited in claim 1, wherein the fill material is ceramic.

9. The product as recited in claim 1, wherein a density of the carbon nanotubes is in a range of $10^{11}$ and $10^{13}$ carbon nanotubes per square centimeter.

10. The product as recited in claim 1, wherein the plurality of carbon nanotubes and the fill material are a single composite, wherein the single composite has a local thickness equal to a longitudinal length of each of the carbon nanotubes.

11. The product as recited in claim 1, wherein a measurement of gas transfer between opposite sides of the product comprises a gas diffusivity value and a Knudsen diffusion prediction value, wherein the gas diffusivity value is greater than 20 times the Knudsen diffusion prediction value.

12. A product, comprising:
a plurality of carbon nanotubes having substantially parallel longitudinal axes; and
a fill material in interstitial spaces between the carbon nanotubes for limiting or preventing fluidic transfer between opposite sides of the product except through interiors of the carbon nanotubes,
wherein an average inner diameter of the carbon nanotubes is about 20 nanometers or less,
wherein ends of the carbon nanotubes are open,
wherein the fill material is configured to prevent penetration of chemicals and biologicals having a size larger than a water molecule into the fill material by size exclusion,
wherein the fill material is reactive with the chemicals.

13. The product as recited in claim 12, wherein the average inner diameter of the carbon nanotubes is less than about 4 nanometers, wherein the fill material comprises pores having an average diameter of less than 4 nanometers.

14. The product as recited in claim 12, wherein the fill material has an average porosity that is less than the average inner diameter of the carbon nanotubes.

15. The product as recited in claim 12, wherein the fill material is permeable for water vapor, wherein the fill material provides a chemical barrier to chemicals and/or biologicals.

16. The product as recited in claim 12, wherein the fill material is polymeric.

17. The product as recited in claim 12, wherein the fill material is ceramic.

18. The product as recited in claim 12, wherein a density of the carbon nanotubes is in a range of $10^{11}$ and $10^{13}$ carbon nanotubes per square centimeter.

19. A method, comprising:
forming a plurality of carbon nanotubes having substantially parallel longitudinal axes, wherein an average inner diameter of the carbon nanotubes is about 20 nanometers or less;
filling interstitial spaces between the carbon nanotubes with a fill material for preventing penetration by size exclusion of at least any material through the interstitial spaces having a size greater than the average inner diameter of the carbon nanotubes,
wherein the fill material is permeable to water vapor; and
after filling the interstitial spaces, opening ends of the carbon nanotubes.

20. The method as recited in claim 19, wherein the fill material has an average porosity that is less than the average inner diameter of the carbon nanotubes.

21. The method as recited in claim 19, wherein the average inner diameter of the carbon nanotubes is less than about 6 nanometers.

22. The method as recited in claim 19, wherein the average inner diameter of the carbon nanotubes is less than about 4 nanometers.

23. The method as recited in claim 19, wherein a density of the carbon nanotubes is in a range of $10^{11}$ and $10^{13}$ carbon nanotubes per square centimeter.

24. The method as recited in claim 19, wherein the fill material is permeable for water vapor, wherein the fill material provides a chemical barrier to chemicals and/or biologicals.

* * * * *